US007053623B2

(12) United States Patent
McMurray et al.

(10) Patent No.: US 7,053,623 B2
(45) Date of Patent: May 30, 2006

(54) SPARK IGNITION SYSTEM WITH DIAGNOSTIC CAPABILITIES

(75) Inventors: Mark S. McMurray, Toledo, OH (US); James D. Lykowski, Temperance, MI (US)

(73) Assignee: Federal-Mogul Worldwide, Inc., Southfield, MI (US)

( * ) Notice: Subject to any disclaimer, the term of this patent is extended or adjusted under 35 U.S.C. 154(b) by 0 days.

(21) Appl. No.: 10/981,825

(22) Filed: Nov. 5, 2004

(65) Prior Publication Data

US 2005/0093550 A1 May 5, 2005

Related U.S. Application Data

(66) Substitute for application No. 60/517,540, filed on Nov. 5, 2003.

(51) Int. Cl.
*G01R 1/04* (2006.01)

(52) U.S. Cl. ...................................... 324/402; 324/380

(58) Field of Classification Search .................... None
See application file for complete search history.

(56) References Cited

U.S. PATENT DOCUMENTS

| | | | | |
|---|---|---|---|---|
| 1,344,954 | A | 6/1920 | Meyer | |
| 1,519,707 | A | 12/1924 | Russell | |
| 1,812,438 | A | 6/1931 | Hurley | |
| 1,896,444 | A | 2/1933 | Fossati | |
| 2,048,891 | A | 7/1936 | Rabezzana | 123/169 |
| 2,071,571 | A | 2/1937 | Rabezzana et al. | 123/169 |
| 2,071,572 | A | 2/1937 | Rabezzana et al. | 123/169 |
| 2,127,983 | A | 8/1938 | Nowosielski | 123/169 |
| 2,183,696 | A | 12/1939 | Rohde | 123/169 |
| 2,270,765 | A | 1/1942 | Nowosielski | 123/169 |
| 2,321,782 | A | 6/1943 | Von Mertens | 173/269 |
| 2,399,402 | A | 4/1946 | Spengler | 123/169 |
| 2,459,286 | A | 1/1949 | Rabezzana et al. | 123/169 |
| 2,597,978 | A | 5/1952 | Doran | 123/169 |
| 2,630,107 | A | 3/1953 | Field | 123/169 |
| 2,633,116 | A | 3/1953 | Ingram | 123/169 |
| 2,651,298 | A | 9/1953 | Brinson et al. | 123/169 |
| 2,702,537 | A | 2/1955 | Wright et al. | 123/169 |
| 2,829,063 | A | 4/1958 | Schwartzwalder et al. | 106/85 |

(Continued)

FOREIGN PATENT DOCUMENTS

FR 2 581 802 A4 12/1984

(Continued)

*Primary Examiner*—Vincent Q. Nguyen
(74) *Attorney, Agent, or Firm*—Dickinson Wright PLLC

(57) ABSTRACT

An ignition and diagnostic system (10) for an internal combustion engine includes a sparking device (12) through which a low voltage diagnostic device (54) monitors a sensing feature, for example spark gap (30) conditions, during spark intervals and returns diagnostic feedback to an engine control module (56). A coil (44) is electrically operatively connected to the sparking device (12) through a lead wire (48). The lead wire (48) can be removed and reinstalled with respect to the sparking device (12) via a flexor joint (60) for installation and maintenance. The flexor joint (60) enables positive electrical contact during operation so that low voltage signals from the diagnostic device (54) are maintained even during severe vibration conditions. The flexor joint (60) includes in one embodiment a compression spring (62) which is fully compressed or over-compressed. In another embodiment, the flexor joint (60) comprises a tubular sleeve (64, 64') having cantilevered upper tangs (70, 70') which resiliently engage the lead wire (48), and lower tangs (76) which similarly engage the center wire (32) of the sparking device (12) in a resilient manner.

34 Claims, 5 Drawing Sheets

U.S. PATENT DOCUMENTS 2,837,679 A 6/1958 Schwartzwalder et al. .. 313/415
2,874,208 A 2/1959 Pierce ........................ 174/152
2,902,617 A 9/1959 Cole .......................... 313/144
2,906,909 A 9/1959 Somers et al. .............. 313/145
2,943,139 A 6/1960 Skunda ........................ 174/77
2,977,498 A 3/1961 Bychinsky .................. 313/134
3,050,658 A 8/1962 Lay et al. ..................... 315/85
3,076,113 A 1/1963 Candelise ................... 313/135
3,229,032 A 1/1966 Willis ......................... 174/152
3,256,457 A 6/1966 Bretsch ...................... 313/141
3,334,326 A 8/1967 Besore et al. ................. 339/26
3,569,765 A 3/1971 Moray ........................ 313/135
4,082,976 A 4/1978 Lentz ......................... 313/135
4,193,012 A 3/1980 Podiak et al. ............... 313/137
4,307,316 A 12/1981 McKechnie ................. 313/143
4,460,847 A 7/1984 Englehardt ................... 315/58
5,547,387 A 8/1996 Kobayashi .................. 439/125
6,069,434 A 5/2000 Clifford ...................... 313/141
6,078,131 A 6/2000 McMurray .................. 313/145
6,170,451 B1 1/2001 Moriya ................. 123/169 PA
6,191,525 B1 2/2001 Tanaka et al. .............. 313/141
6,310,430 B1 10/2001 Moriya ....................... 313/141

FOREIGN PATENT DOCUMENTS

FR 2 581 803 A4 12/1984
FR 2 581 804 A4 12/1984

FIG - 2
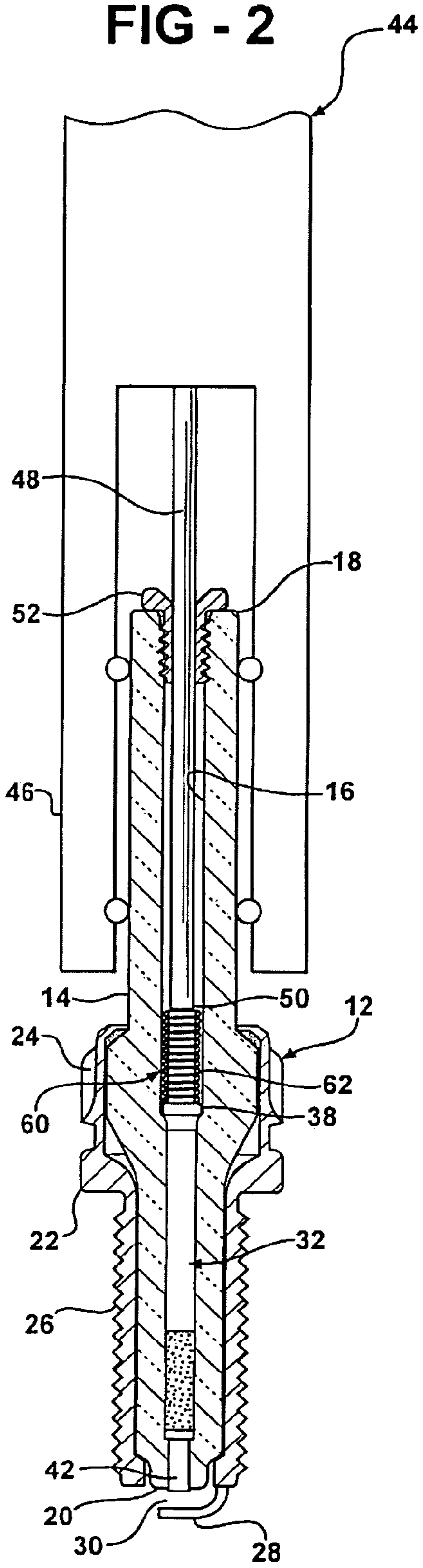
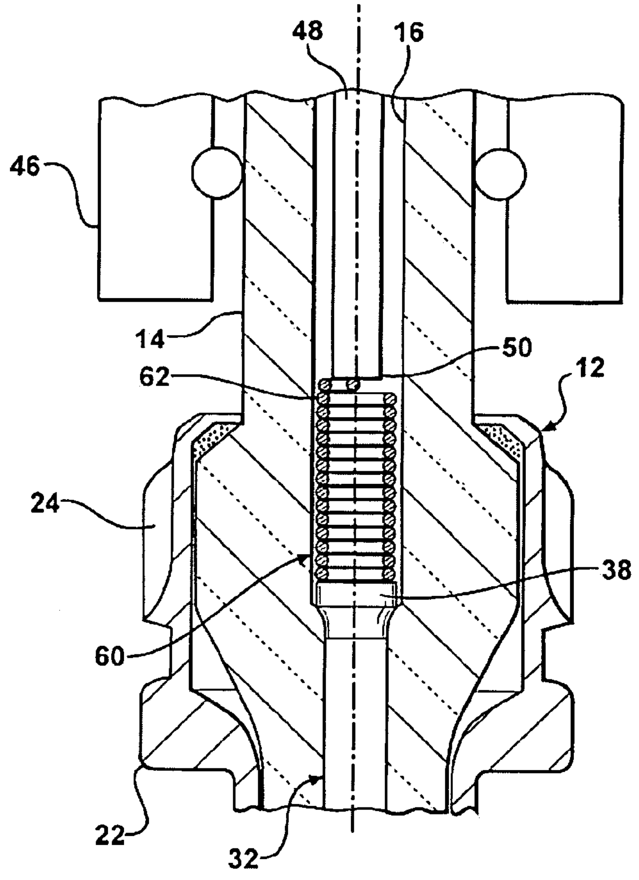
FIG - 3

FIG - 7
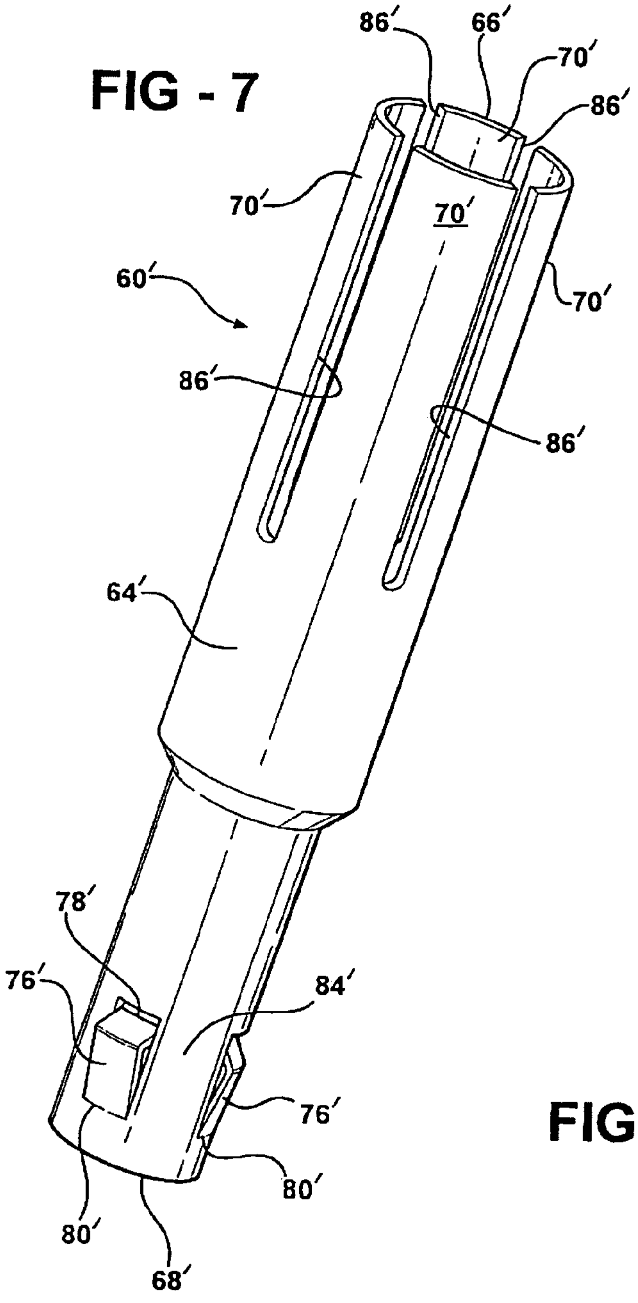
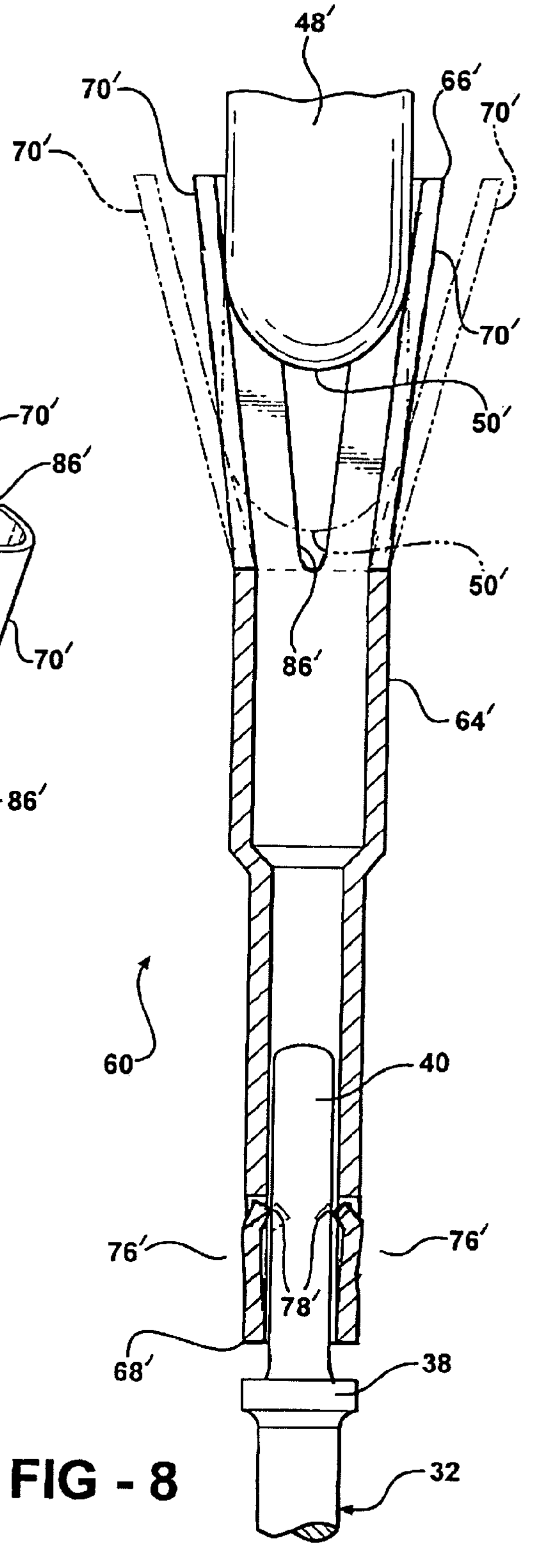
FIG - 8

SPARK IGNITION SYSTEM WITH DIAGNOSTIC CAPABILITIES

This invention claims priority to U.S. Provisional Application No. 60/517540 filed Nov. 5, 2003.

BACKGROUND OF THE INVENTION

1. Field of the Invention

The present invention relates generally to spark plugs, igniters, and other such ignition devices and to techniques for connecting an incoming terminal contact to the center electrode assembly of the ignition device. More particularly, the invention relates to a terminal end connection specifically designed to provide a continuous, uninterrupted electrical connection with an ignition lead or ignition coil high-voltage terminal so that the spark gap or other sensor diagnostic feature can be conducted at low voltages in the interval between sparks.

2. Related Art

Numerous types of connections have been used for electrically coupling an ignition lead to the terminal end of a spark plug. Their particular construction depends largely upon the specific application for which they are used. For instance, some spark plugs have a bulbous-shaped terminal electrode that connects with a complementary shaped protective boot located at the end of the ignition lead. Other spark plugs employ a threaded terminal electrode for attachment to an ignition lead also having a similarly threaded end. Although connections such as these have been used extensively in the industry and provide many desirable advantages, additional considerations must be taken into account when the spark plugs are used in connection with coils and high vibration applications, such as Formula 1, motorcycles, snowmobiles, etc., and further when low voltage diagnostics, such as ion sensing in the spark gap, are required to provide continuous, uninterrupted feedback to an engine computer control module. These connections must also posses the ability to quickly connect/disconnect the coil lead from the sparking device.

In coil-on-plug applications, high levels of vibration can cause the connection between the high voltage coil terminal and the spark plug terminal electrode to become non-continuous and intermittent. Though an intermittent contact does not usually prevent a higher voltage ignition pulse from transmitting through to the spark plug (as these pulses usually have a voltage ranges from 5,000 volts to 40,000 volts typically and are thus capable of bridging most small distance gaps), it can present certain problems when low voltage diagnostics are involved. Spark plugs are more frequently being used for combustion diagnostics. For example, the current in the spark gap can be monitored between firings and used as data indicative of certain aspects of the combustion process. Other examples of combustion chamber diagnostics via the spark plug might include stain gauge sensing, pressure sensing, piezo electric devices, thermocouples, etc. In such instances, it becomes more important to avoid unintended breaks in the conductive path to the spark gap, since sensing takes place at much lower voltages than is used for spark discharge. For example, ion sensing in the spark gap takes place in the range of 150–200 volts, while other diagnostic systems may require signals in the 1–50 volt ranges, and even others in the millivolt ranges.

It is an increasingly held belief that more sophisticated combustion chamber monitoring using low voltage diagnostics can, when implemented effectively, replace many of the prior art type sensing devices currently used in connection with internal combustion engines. For example, it may be possible to eliminate the crank position sensor, the oxygen sensor, or any of the other numerous sensors which typically provide feedback to a computer control module if effective and continuous condition feedback via the spark plug is provided to the computer control device. For this to be achievable, the stream of feedback information from the low voltage diagnostic equipment must be reliably continuous. Prior art connections between the coil lead wire and the spark plug center electrode include too much flexibility and inherent resiliency to achieve reliably continuous contact during high vibration situations.

An intermittent connection between the ignition coil high voltage output terminal and the spark plug terminal electrode can also accelerate wear and physical damage to the connection components. As these components intermittently contact each other, portions of the components are damaged and worn away. Additionally, the intermittent connection causes the high voltage ignition pulse traveling from the ignition lead to the spark plug to arc from one component to the other, thus causing pitting and other deterioration of the components. This is particularly true in applications employing coil-on-plug or coil-over-plug technologies, as the added mass of the coil promotes significant independent movement of the ignition lead with respect to the spark plug center electrode.

Moreover, intermittent contact between the high coil voltage terminal and the spark plug terminal can cause an increase in the emission of electromagnetic interference, or noise. Each time the connection between these to components is broken, the high voltage ignition pulse forms an arc between the two components, thereby causing a certain amount of noise to be given off. This noise may interfere with sensitive electronic circuitry located on the vehicle, and is generally undesirable.

Thus, it would be advantageous to provide a sparking device having a center wire assembly that connects to a coil terminal such that a continuous, uninterrupted, and reliable connection is established. It would also be advantageous to provide a separable coil and plug in which continuous contact is maintained between the coil high voltage and spark plug center wire assembly.

SUMMARY OF THE INVENTION AND ADVANTAGES

The above-noted shortcomings of prior art ignition device input connections are overcome by the present invention which provides a sparking ignition system with diagnostic capabilities for an internal combustion engine which is controlled by a computer control module. The sparking ignition system includes a sparking device having an electrical insulator with a longitudinal bore, a grounding electrode, and an electrically conductive center wire supported in the longitudinal bore which includes a firing end proximate the grounding electrode for producing a spark in a spark gap therebetween. The sparking device included a sensing feature electrically connected between the center wire and the grounding electrode. A coil is provided for generating intermittent high voltage signals. A lead wire transfers the intermittent high voltage signals from the coil to the center wire to produce cyclical sparks in the spark gap. A low-voltage diagnostic device is operatively connected to the lead wire for sending low voltage signals to and receiving low voltage signals from the sensing feature in the interval between sequential sparks and returning diagnostic feedback to an engine control module. An electrically conductive flexor joint operatively interconnects the lead wire and the center wire for maintaining a positive electrical connection between the lead wire and the center wire during severe relative motions therebetween so that the low voltage signals traveling between the lead wire and the center wire are uninterrupted even during severe vibration conditions to provide continuous diagnostic feedback to the engine control module.

According to a first embodiment of the invention, the flexor joint comprises a compression spring having a continuous, generally helical coil within the longitudinal bore of the sparking device and which is at least fully compressed to solid coil height. In this manner, the highly compressed spring acts with better responsiveness than a prior art style partially compressed spring to provide continuous low voltage signal service to the sensing feature via the center wire.

According to another embodiment of the invention, the flexor joint comprises a conductive sleeve which is operatively disposed within the longitudinal bore and slideably receives each of the lead and center wires and the respective upper and lower ends thereof. The sleeve has a plurality of opposing upper tangs near its upper end which are resiliently biased toward the lead wire so that the upper tangs exert substantially balanced opposing forces upon the lead wire. Similarly, the sleeve has a plurality of opposing lower tangs adjacent its lower end which are resiliently biased toward the center wire such that the lower tangs exert substantially balanced opposing forces upon the center wire. In this manner, the conductive sleeve functions to effectively transmit low voltage signals between the lead wire and the center wire even during severe vibration conditions, because the lead and center wires are permitted to move radially and axially relative to the sleeve without discontinuing the low voltage service between the sensing feature and the diagnostic device.

By ensuring that low voltage signals will be reliably transmitted between the diagnostic device and the sensing feature, the engine control module can make use of ion sensing and other in-cylinder measurements which are useful to effectively control engine performance, and thereby provide opportunity to eliminate other sensor devices and reduce costs and increase performance of the engine.

BRIEF DESCRIPTION OF THE DRAWINGS

These and other features and advantages of the present invention will become more readily appreciated when considered in connection with the following detailed description and appended drawings, wherein:

FIG. 2 is a cross-sectional view showing a sparking device according to a first embodiment of the invention;

FIG. 3 is an enlarged cross-sectional view as in FIG. 2 showing the compression spring being at least fully compressed to solid coil height;

FIG. 7 is a perspective view of a second alternative embodiment of the conductive sleeve; and FIG. 8 is a cross-sectional view of the second embodiment of the conductive sleeve showing the lead and center wires in various shifted positions in phantom resulting from severe vibration conditions.

DETAILED DESCRIPTION

Figure 1:
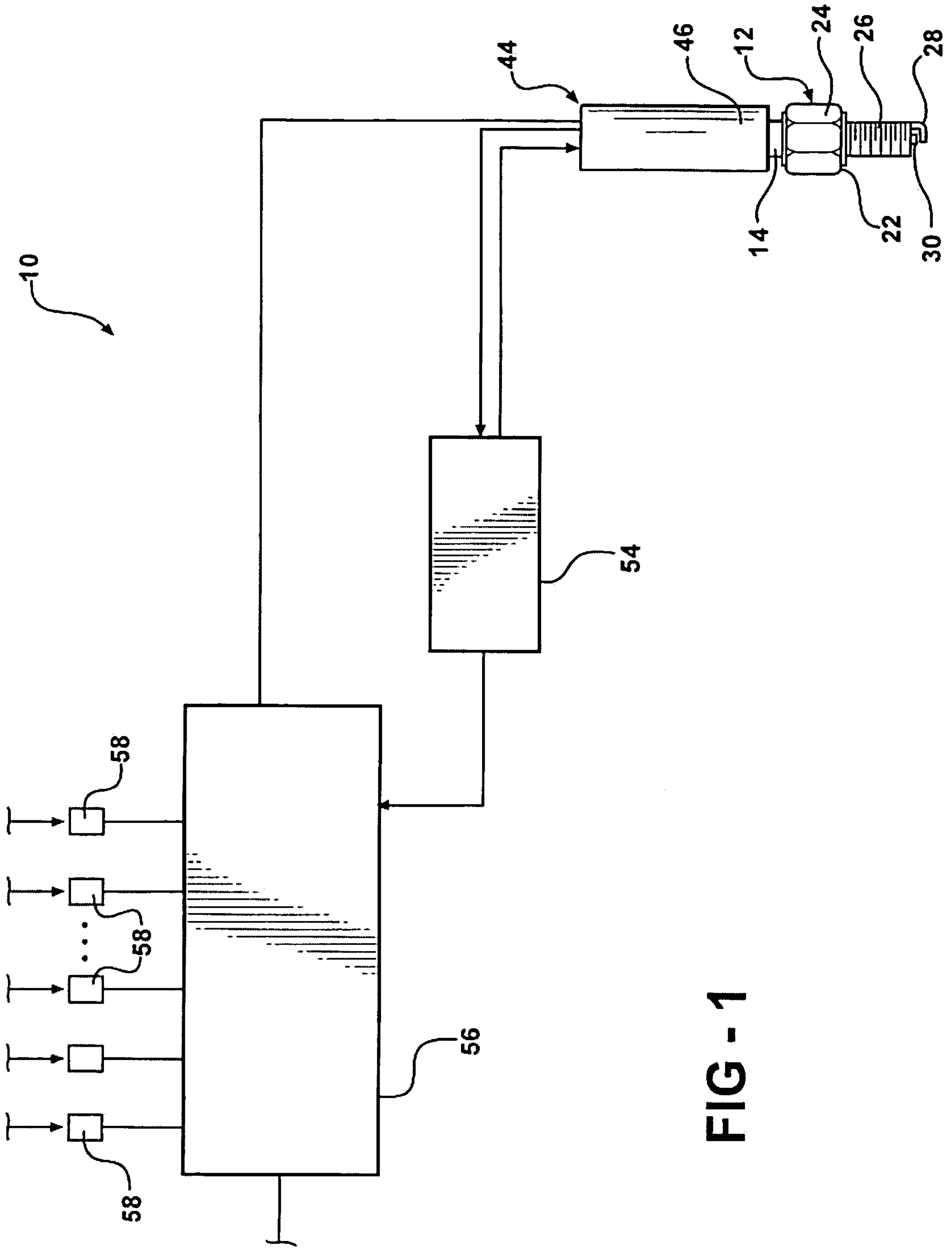
FIG. 1 is a schematic view of a sparking ignition system, a diagnostic device, and a computer control module for an internal combustion engine.

Referring to the figures, wherein like numerals indicate like or corresponding parts throughout the several views, a sparking ignition system with diagnostic capabilities for an internal combustion engine controlled by a computer control module is generally shown at 10 in FIG. 1. The system 10 includes a sparking device, generally indicated at 12, which, in the preferred embodiment, comprises a spark plug. However, the sparking device 12 may include igniters and other such ignition devices for creating a timed spark in the combustion chamber (or a pre-chamber) of an internal combustion engine.

Figure 4:
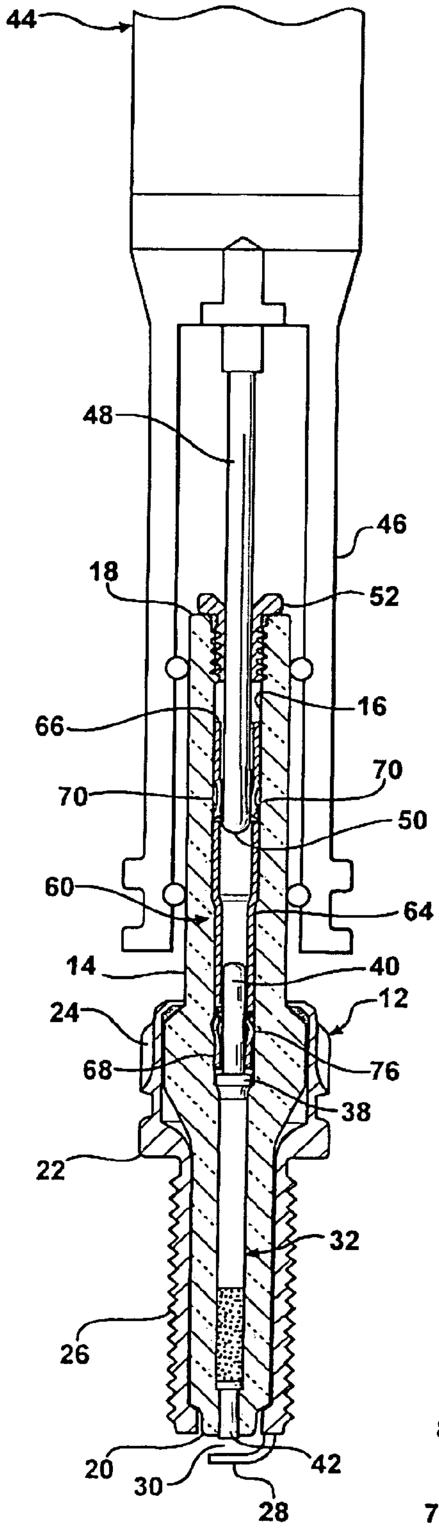
FIG. 4 is a cross-sectional view of an alternative embodiment of the subject sparking ignition system.

As shown in FIGS. 2 and 4, the sparking device 12 includes an electrical insulator 14 typically made of a ceramic material. The insulator 14 includes an internal longitudinal bore 16 which passes fully from an upper end 18 of the insulator 14 to a lower end 20. A shell 22, typically fabricated from steel encases the lower half of the insulator 14 and is provided with a tool grip 24, for example a hexagon, and installation threads 26. The shell 22 is grounded electrically together with the combustion engine. A grounding electrode 28 may be formed with a generally cantilevered rectangular cross-section to form one end of spark gap 30 which is presented in the combustion chamber, or a pre-chamber, of an internal combustion engine. Alternatively, the grounding electrode 28 can have plural cantilevered features, or in the case of surface gap applications consist of the lower most end of the shell 22.

The sparking device 12 also includes a center wire, generally indicated at 32 which is supported in the longitudinal bore 16. The center wire 32 has an internal end which, in the example of FIGS. 2 and 3 comprises a flanged head 38. In the example of FIGS. 4 through 8, the internal end includes a cylindrical post 40 projecting axially from the flanged head 38. The center wire 32 also has an external end forming a firing tip 42 which terminates proximate the grounding electrode 28. The spark gap 30 is thus formed in the space between the grounding electrode 28 and the firing tip 42.

The sparking device 12 includes a sensing feature electrically connected between the center wire 32 and the grounding electrode 28. The sensing feature may, as shown in the Figures, comprise merely the spark gap 30 in the case of ion gap sensing type diagnostics. Alternatively, the sensing feature may comprise a stain gauge mounted to the insulator 14 or to the shell 22 and electrically joined between the center electrode 32 and the ground electrode 28. Or, the sensing feature may comprise a pressure sensor located near the firing tip 42 and electrically joined between the center electrode 32 and the ground electrode 28. Alternatively, the sensing feature could include a piezo electric device, a thermocouple, or any other such low voltage sensing means which is carried on the sparking device and electrically joined between the center electrode 32 and the ground electrode 28 for receiving a low voltage signal in the brief interval between high-voltage firings.

Referring again to FIG. 1, the sparking ignition system 10 is shown including a coil, generally indicated at 44, for generating intermittent high voltage signals. The coil 44 provides a timed electrical discharge of sufficient energy to create a robust spark in the spark gap 30 thus igniting the compressed air/fuel mixture in the cylinder of an engine. The voltage needed to produce this electrical discharge is most often generated by means of an auto-transformer where the current in the primary in the ignition coil 44 is interrupted at the desired time of ignition.

The coil 44 can be of either the conventional, remotely located type, or the coil-on-plug type wherein the coil 44 is supported directly upon the sparking device 12 by means of a boot 46. In the coil-on-plug application, the boot 46 is integral with an electrically insulated jacket of the coil 44. An electrically conducting lead wire 48 extends from the primary of the ignition coil 44, through the boot 46, to a terminal end 50. The terminal end 50 is preferably a blunt-nosed cylindrical member of sufficient rigidity and column strength to withstand the connection process to the center wire 32 as discussed below. A terminal cap 52, generally cylindrical and similar to a bushing, is threaded into the upper end 18 of the insulator 14, such that it supports the high voltage lead wire 48 centered within the longitudinal bore 16. The terminal cap 52 may be formed of steel, brass or any other rigid material, and generally includes exterior threads and a top flange which seats over the insulator 14. The terminal cap 52 may be plated for increased protection against wear or corrosion, and are designed to interact with interior threads formed in the insulator's longitudinal bore 16. Accordingly, the terminal cap 52, which may be removed and replaced as needed, acts as both a guide and a support for the lead wire 48 which is freely axially slidable therein.

In FIG. 1, a low-voltage diagnostic device 54 is shown operatively connected to the lead wire 48 for sending a low voltage signal to and receiving a low voltage signal from the spark gap 30 or other internal sensing feature such as those described above. In the example of ion sensing, low voltage signals on the order of 150–250 volts are transmitted to the firing end 42 of the center wire 32 in the time interval between sequential sparks in the spark gap 30. The diagnostic device 54 includes a detection circuit of any known type which measures some useful condition in the combustion chamber such as, by way of example only, the ionization caused by a flame front across the spark plug's electrodes prior to electrical ignition. Whenever the flame front passes through the spark gap 30, the gap becomes conductive and the current flow pattern can be measured within the diagnostic device 54. This information is then fed to the computer control module 56 to make engine operation adjustments and improve the operational efficiency of the engine. The computer control module 56 may receive inputs from additional sensors 58, external of the combustion chamber, which for example may include an oxygen sensor, and RPM sensor, a crankshaft position sensor, a MAP sensor, an airflow sensor, a barometric sensor, a coolant temperature sensor, a throttle position sensor, and the like.

Because a low voltage signal can be impeded by even small monetary breaks in the conductive path between the diagnostic device 54 and the internal sensing feature, it is imperative that the removable connection between the coil 44 and the sparking device 12 be provided with a means by which positive electrical connection can be reliably maintained continuously, even during severe vibration conditions. If the internal sensing feature survey using the diagnostic device 54 is reliable, one or more of the external sensors 58 can be eliminated from the engine control system, thus resulting in cost savings and potentially improved engine management capabilities. This elimination of external sensors 58 places extreme importance upon maintaining a continuous reliable connection between the removable coil 44 and the sparking device 12. Thus, the invention proposes an electrically conductive flexor joint, generally indicated at 60, which operatively and removably interconnects the lead wire 48 and the center wire 32 while maintaining a positive electrical connection even during severe relative motions. Low voltage signals produced by the diagnostic device 54 which are transmitted between the lead wire 48 and the center wire 32 will remain uninterrupted even during severe vibration conditions so as to provide continuous diagnostic feedback from the internal sensing feature to the engine control module 56.

As shown in FIGS. 2 and 3, the flexor joint 60 may comprise a compression spring 62 having a continuous and generally helical coil which is operatively disposed within the longitudinal bore 16 of the insulator 14. The compression spring 62 extends between the flanged head 38 of the center wire 32 and the terminal end 50 of the lead wire 48. The compression spring 62 is sized and designed to compress to at least fully compressed solid coil height when the lead wire 48 is fully seated in the longitudinal bore 16. Preferably, the compression spring 62 is slightly over-compressed, such that its coils are crushed. This condition ensures that positive electrical contact will be maintained even if severe influences cause movement of the lead wire 48 in longitudinal and lateral directions. Thus, the flexor joint 60 adapts to three-dimensional relative movements of the lead wire 48 relative to the center wire 32.

Figure 6:
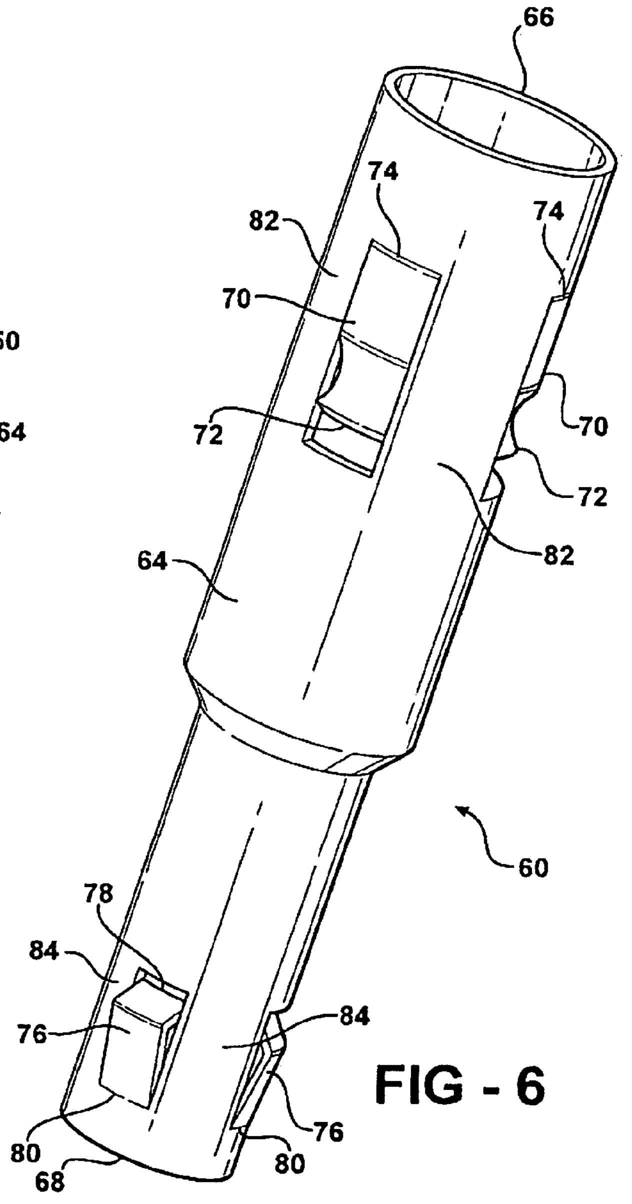
FIG. 6 a perspective view of the conductive sleeve.
Figure 5:
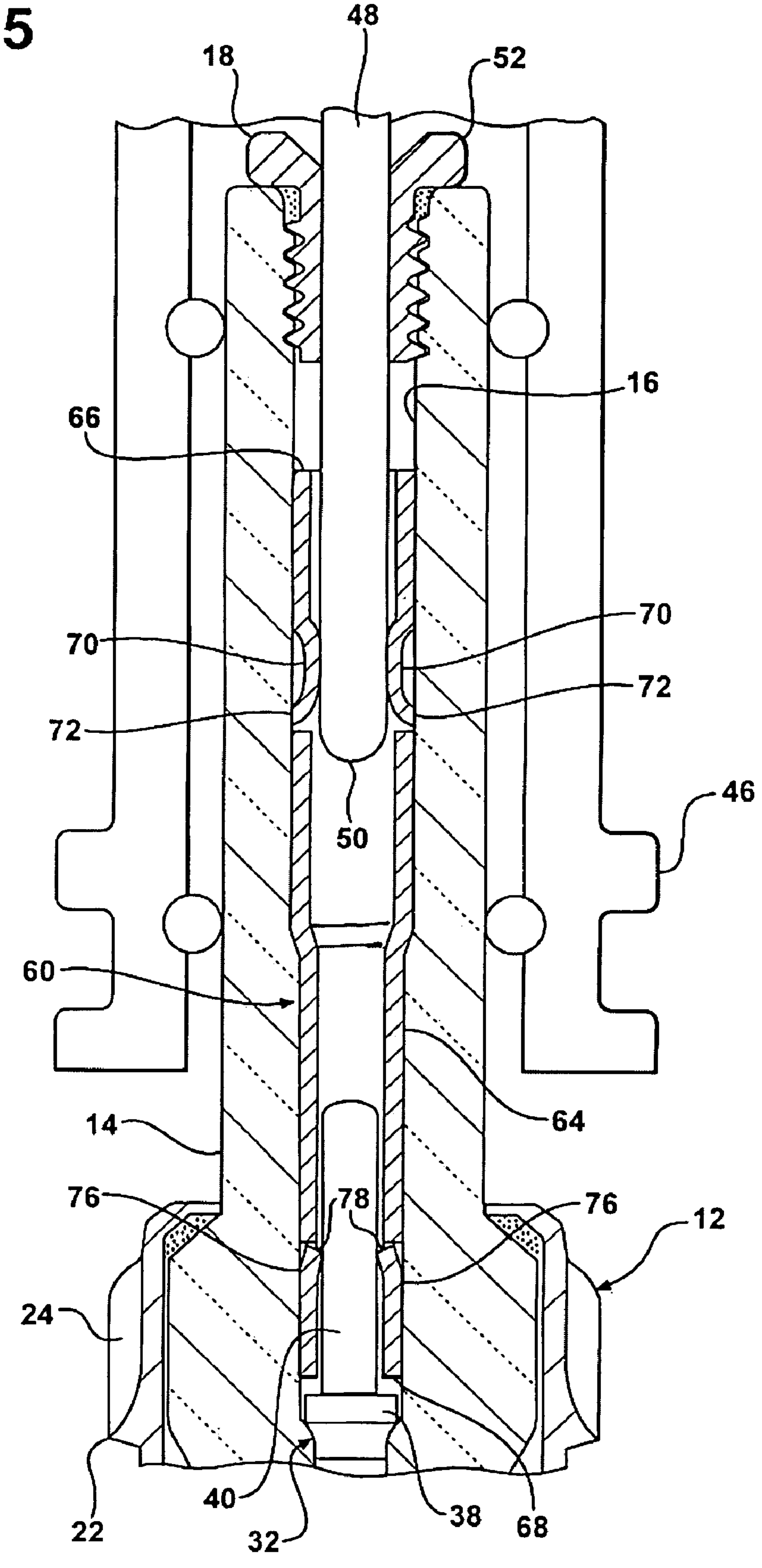
FIGS. 5 is an enlarged cross-sectional view of the conductive sleeve.

Referring now to FIGS. 4 through 6, an alternative embodiment of the flexor joint 60 is shown comprising an electrically conductive sleeve 64 which is generally cylindrical and tubular in shape and is operatively disposed within the longitudinal bore 16 for slideably receiving each of the lead 48 and center 32 wires into respective upper 66 and lower 68 ends thereof. The sleeve 64 has at least one, and preferably three or four or more opposing, upper tangs 70 adjacent its upper end 66. The upper tangs 70 are resiliently biased toward the lead wire 48 so that they exert substantially balanced opposing forces upon the lead wire 48. The upper tangs 70 may be equally spaced about the sleeve 64 and in the preferred embodiment have a cantilever configuration with a resilient free engagement end 72 and a fixed hinge end 74. The engagement end 72 of upper tang 70 is provided with an arcuate bend which presses against the smooth, continuous cylindrical surface of the terminal end 50 of the lead wire 48. The arcuate bend facilitates insertion and removal of the lead wire 48 into the sleeve 64, and enables the two components to slide axially relative to one another in the event external forces acting upon the bodies necessitate a sliding condition. Nevertheless, the electrical path will be maintained throughout so that low voltage signals passing through these components will not be disrupted. Furthermore, if multiple opposing upper tangs 70 are used, lateral movement between the lead wire 48 and the sleeve 64, such as during vibration, press the lead wire 48 into contact with at least one of the tangs 70, thus maintaining positive contact. This is distinguished from prior art configurations where vibration can induce a lead wire to, at least momentarily, move away from contact with an adjacent conductive member.

The sleeve 64 also includes at least one, and preferably three or four or more, lower tangs 76 adjacent the lower end 68. The lower tangs 76, like the upper tangs 70, are resiliently biased toward the center wire 32 such that the lower tangs 76 exert substantially balanced opposing forces upon the center wire 32. Unlike the upper tangs 70 which are designed for continuous sliding contact with the lead wire 48, the lower tangs 76 are designed to grip the cylindrical post 40 extending above the flanged 38 on the center wire 32 using inwardly angled teeth 78. The teeth 78 are supported in cantilever fashion from an integral hinged end 80 and are designed so as to allow the lower end 68 of the sleeve 64 to be pressed over the cylindrical post 40, but not removed therefrom. This configuration assures the sleeve 64 will be securely retained in the sparking device 12 during installation and maintenance. The lower tangs 76, which are also spaced equally about the lower end 68 of the sleeve 64, enable continuous electrical contact between the sleeve 64 and the center wire 32.

As best shown in FIG. 6, the upper end 66 of the sleeve 64 has a slightly larger diameter than the lower end 68. The upper tangs 70 are separated by non-flexible wall portions 82 of the sleeve 64, whereas the lower tangs 76 are similarly separated by non-flexible wall portions 84.

In FIGS. 7 and 8, an alternative embodiment of the sleeve 64' is shown with the upper tangs 70' comprising upwardly extending fingers separated by slots 86'. In this example, four slots 86' are equally spaced about the upper end 66' of the sleeve 64', although the equal spacing is not mandatory. The internal diameter of the upper end 66', in its free state, is smaller than the external diameter of the terminal end 50' of the lead wire 48'. Thus, as relative axial movement is introduced between the lead wire 48' and the sleeve 64', the upper tangs 70' will flex while maintaining electrical contact, as shown exaggerated in phantom in FIG. 8. As an alternative, the external diameter of the lead wire 48' can be made only slightly smaller that the inter diameter of the sleeve 64' just below the slots 86', i.e., with a sliding clearance fit in the unslotted section. In this situation, the upper tangs 70' would be formed with a free state condition bent inwardly so that they expand to a generally uniform tubular diameter when the lead wire 48' is inserted therein.

The preceding description is suggestive of a coil-on-plug type coil 44, however this is but one of many types of ignition coils that may be used in conjunction with the sparking device 12 of the subject invention. Other types of coils or ignition leads, as well as the sparking device components necessary to connect with those different types of ignition leads, can be used. The embodiments of FIGS. 2 through 8 lend themselves well to conventional sparking device manufacturing techniques, since the fundamental design features of the shell 22 and the insulator 14 are well known and since the center wire 32 can be constructed and assembled into the insulator from the upper end 18 using known techniques.

It will thus be apparent that there has been provided in accordance with the present invention an ignition device and coil assembly having a removable connection which nevertheless maintains a reliable constant contact when operatively engaged so that the aims and advantages specified above can be achieved. It will, of course, be understood that the foregoing description is of preferred exemplary embodiments of the invention, and that the invention is not limited to the specific embodiments shown. For instance, alternative designs of the flexor joint 60 can be used. Other changes and modifications, in addition to those previously mentioned, will become apparent to those skilled in the art and all such changes and modifications are intended to be within the scope of the appended claims.

What is claimed is:

1. A sparking ignition system with diagnostic capabilities for an internal combustion engine controlled by a computer control module, said sparking ignition system comprising:

a sparking device having an electrical insulator with a longitudinal bore, a grounding electrode, and an electrically conductive center wire supported in said longitudinal bore and including a firing end proximate said grounding electrode for producing a spark therebetween;

said sparking device including a sensing feature electrically connected between said center wire and said grounding electrode;

a coil for generating intermittent high voltage signals;

a lead wire for transferring the intermittent high voltage signals from said coil to said center wire to produce cyclical sparks between said firing end and said grounding electrode;

a low voltage diagnostic device operatively connected to said lead wire for sending a low voltage signal to and receiving a low voltage return signal from said sensing feature in the interval between sequential sparks and returning diagnostic feedback to an engine control module;

and an electrically conductive flexor joint operatively interconnecting said lead wire and said center wire for maintaining a positive electrical connection between said lead wire and said center wire during severe relative motions therebetween such that the low voltage signals traveling between said lead wire and said center wire are uninterrupted even during harsh vibration conditions to provide continuous diagnostic feedback to the engine control module.

2. A system as set forth in claim 1 wherein said lead wire is rigid and capable of sustaining an axial load, and said flexor joint comprises a compression spring having a continuous generally helical coil operatively disposed within said longitudinal bore between said center wire and said rigid lead wire.

3. A system as set forth in claim 2 wherein said spring is at least fully compressed to a solid coil height condition.

4. A system as set forth in claim 3 wherein said center wire includes a flanged head adjacent said spring.

5. A system as set forth in claim 1 wherein said lead wire is rigid and capable of sustaining an axial load, and said flexor joint comprises an electrically conductive sleeve operatively disposed within said longitudinal bore and slideably receiving each of said rigid lead and center wires into respective upper and lower ends thereof.

6. A system as set forth in claim 5 wherein said sleeve has at least one upper tang adjacent said upper end and resiliently biased inwardly such that said upper tang exerts a force upon said lead wire.

7. A system as set forth in claim 6 wherein said rigid lead wire has a smooth, continuous cylindrical engagement surface adjoining said upper tang.

8. A system as set forth in claim 6 wherein said sleeve has at least one lower tang adjacent said lower end and resiliently biased toward said center wire such that said lower tang exerts a force upon said center wire.

9. A system as set forth in claim 8 wherein said center wire has a smooth, continuous cylindrical post adjoining said lower tang.

10. A system as set forth in claim 9 wherein said upper tang has an arcuately bent free end.

11. A system as set forth in claim 9 wherein said lower tang has an inwardly angled tooth.

12. A system as set forth in claim 8 wherein three of said upper tangs are spaced about said upper end of said sleeve.

13. A system as set forth in claim 8 wherein four of said upper tangs are spaced equally about said upper end of said sleeve.

14. A system as set forth in claim 8 wherein three of said lower tangs are spaced about said lower end of said sleeve.

15. A system as set forth in claim 8 wherein four of said lower tangs are spaced about said lower end of said sleeve.

16. A system as set forth in claim 8 wherein said upper end of said sleeve is defined by a generally cylindrical portion having a diameter and said lower end of said sleeve is defined by a generally cylindrical portion having a diameter smaller than the diameter of said upper end.

17. A system as set forth in claim 8 wherein at least two of said upper tangs are spaced about said upper end of said sleeve and separated by non-flexible wall portions of said sleeve.

18. A system as set forth in claim 8 wherein at least two of said upper tangs are spaced about said upper end of said sleeve and separated by slots in said sleeve.

19. A system as set forth in claim 1 wherein said coil includes an electrically insulated jacket, said jacket including a tubular boot for gripping said insulator of said sparking device to support said coil directly upon said sparking device.

20. A sparking ignition system with diagnostic capabilities for an internal combustion engine, said sparking ignition comprising:

a sparking device having an electrical insulator with a longitudinal bore, a grounding electrode, and an electrically conductive center wire supported in said longitudinal bore and including a firing end proximate said grounding electrode for producing a spark therebetween;

said sparking device including a sensing feature electrically connected between said center wire and said grounding electrode;

a coil for generating intermittent high voltage signals;

a lead wire for transferring the intermittent high voltage signals from said coil to said center wire to produce cyclical sparks between said firing and said grounding electrode;

a low-voltage diagnostic device operatively connected to said lead wire for sending a low voltage signal to and receiving a low return voltage signal from said sensing feature;

and an electrically conductive compression spring having a continuous generally helical coil operatively disposed within said longitudinal bore between said center wire and said lead wire, said spring being at least fully compressed to a solid coil height condition such that low voltage signals traveling between said lead wire and said center wire are uninterrupted even during severe vibration conditions to provide continuous diagnostic feedback to said low-voltage device.

21. A system as set forth in claim 20 wherein said center wire includes a flanged head adjacent said spring.

22. A sparking ignition system with diagnostic capabilities for an internal combustion engine, said sparking ignition system comprising;

a sparking device having an electrical insulator with a longitudinal bore, a grounding electrode, and an electrically conductive center wire supported in said longitudinal bore and including a firing end proximate said grounding electrode for producing a spark therebetween;

said sparking device including a sensing feature electrically connected between said center wire and said grounding electrode;

a coil for generating intermittent high voltage signals;

a lead wire for transferring the intermittent high voltage signals from said coil to said center wire to produce cyclical sparks between said firing end and said grounding electrode;

a low-voltage diagnostic device operatively connected to said lead wire for sending a low voltage signal to and receiving a low voltage signal from said sensing feature;

and an electrically conductive sleeve operatively disposed within said longitudinal bore and slideably receiving each of said lead and center wires into respective upper and lower ends thereof, said sleeve having at least one upper tang adjacent said upper end and resiliently biased toward said lead wire such that said upper tang exerts a force upon said lead wire, and said sleeve having at least one lower tang adjacent said lower end and resiliently biased toward said center wire such that said lower tang exerts a force upon said center wire, whereby low voltage signals traveling between said lead wire and said center wire are uninterrupted even during severe vibration conditions to provide continuous low voltage signal feedback to said low-voltage diagnostic device.

23. A system as set forth in claim 22 wherein said lead wire has a smooth, continuous cylindrical engagement surface adjoining said upper tangs.

24. A system as set forth in claim 22 wherein said center wire has a smooth, continuous cylindrical post adjoining said lower tang.

25. A system as set forth in claim 23 wherein said upper tang has an arcuately bent free end.

26. A system as set forth in claim 24 wherein said lower tang has an inwardly angled tooth.

27. A system as set forth in claim 22 wherein three of said upper tangs are spaced about said upper end of said sleeve.

28. A system as set forth in claim 22 wherein four of said upper tangs are spaced about said upper end of said sleeve.

29. A system as set forth in claim 22 wherein three of said lower tangs are spaced about said lower end of said sleeve.

30. A system as set forth in claim 22 wherein four of said lower tangs are spaced about said lower end of said sleeve.

31. A system as set forth in claim 22 wherein said upper end of said sleeve is defined by a generally cylindrical portion having a diameter and said lower end of said sleeve is defined by a generally cylindrical portion having a diameter smaller than the diameter of said upper end.

32. A system as set forth in claim 22 wherein at least two of said upper tangs are spaced about said upper end of said sleeve and separated by non-flexible wall portions of said sleeve.

33. A system as set forth in claim 22 wherein at least two of said upper tangs are spaced about said upper end of said sleeve and separated by slots in said sleeve.

34. A system as set forth in claim 22 wherein said coil includes an electrically insulated jacket, said jacket including a tubular boot for gripping said insulator of such sparking device to support said coil directly upon said sparking device.

* * * * *

UNITED STATES PATENT AND TRADEMARK OFFICE
CERTIFICATE OF CORRECTION

PATENT NO. : 7,053,623 B2 Page 1 of 1
APPLICATION NO. : 10/981825
DATED : May 30, 2006
INVENTOR(S) : Mark S. McMurray and James D. Lykowski It is certified that error appears in the above-identified patent and that said Letters Patent is hereby corrected as shown below:

Title page, item [57] In the abstract, line 14 please replace "includes" with -- comprises --.

Signed and Sealed this

Twenty-sixth Day of September, 2006

JON W. DUDAS
*Director of the United States Patent and Trademark Office*